US012802772B2

(12) United States Patent
Ayme

(10) Patent No.: US 12,802,772 B2
(45) Date of Patent: Nov. 17, 2026

(54) LOGIC DEVICE AND SYSTEM AND METHODS FOR DEFINITION AND CONFIGURATION OF A LOGIC DEVICE

(71) Applicant: MENTA, Valbonne (FR)

(72) Inventor: Clément Ayme, Valbonne (FR)

(73) Assignee: MENTA, Valbonne (FR)

( * ) Notice: Subject to any disclaimer, the term of this patent is extended or adjusted under 35 U.S.C. 154(b) by 184 days.

(21) Appl. No.: 18/798,515

(22) Filed: Aug. 8, 2024

(65) Prior Publication Data

US 2025/0061958 A1 Feb. 20, 2025

(30) Foreign Application Priority Data

Aug. 16, 2023 (EP) .................................... 23306382

(51) Int. Cl.

| | |
|---|---|
| ***G11C 29/38*** | (2006.01) |
| ***G06F 21/64*** | (2013.01) |
| ***G06F 21/76*** | (2013.01) |
| ***G11C 29/12*** | (2006.01) |
| ***H03K 19/17728*** | (2020.01) |

(52) U.S. Cl.

CPC .......... *G11C 29/38* (2013.01); *G11C 29/1201* (2013.01); *H03K 19/17728* (2013.01)

(58) Field of Classification Search

None

See application file for complete search history.

(56) References Cited

U.S. PATENT DOCUMENTS

| | | | |
|---|---|---|---|
| 5,027,355 A | 6/1991 | Stoica | |
| 5,432,441 A | 7/1995 | El-Ayat et al. | |
| 5,675,589 A | 10/1997 | Yee et al. | |
| 6,021,513 A | 2/2000 | Beebe et al. | |
| 7,463,056 B1 | 12/2008 | Anderson et al. | |
| 7,971,072 B1 | 6/2011 | Donlin et al. | |
| 8,091,001 B2 | 1/2012 | Yao et al. | |
| 2001/0037458 A1* | 11/2001 | Kean | G06F 21/76 713/193 |

(Continued)

FOREIGN PATENT DOCUMENTS

| | | | |
|---|---|---|---|
| CN | 108 268 801 A | 7/2018 | |
| EP | 3355196 A1 * | 8/2018 | G06F 11/1004 |
| WO | 2012/123243 A1 | 9/2012 | |

OTHER PUBLICATIONS

Aken'ova, "Bridging the Gap between Soft and Hard eFPGA Design", chapter 3.22, 2002. available from https://open.library.ubc.ca/soa/cIRcle/collections/ubctheses/831/items/1.0092104.

*Primary Examiner* — Anh Q Tran

(74) *Attorney, Agent, or Firm* — BakerHostetler

(57) ABSTRACT

A method of defining a logic device is provided wherein the definition incorporates the definition of special auxiliary memory cells reserved for the presentation of a special code, incorporating a signature of the definition as a whole so as to constitute a watermark securing the design as a whole, and possibly other information. In certain embodiments, the special code may incorporate recursive signatures from preceding versions of the same device to as to constitute a watermark blockchain. A LUT based FPGA architecture is proposed with special addressable memory cells reserved for this purpose, wherein case a programming bitstream may constitute a definition in accordance with the inventive method.

13 Claims, 6 Drawing Sheets

(56) References Cited

U.S. PATENT DOCUMENTS

| | | | | |
|---|---|---|---|---|
| 2007/0283193 | A1* | 12/2007 | Lewis | G06F 11/1064 714/48 |
| 2018/0301201 | A1* | 10/2018 | Kantipudi | G11C 29/52 |

* cited by examiner

LOGIC DEVICE AND SYSTEM AND METHODS FOR DEFINITION AND CONFIGURATION OF A LOGIC DEVICE

CROSS-REFERENCE TO RELATED APPLICATION

This application claims priority to foreign European patent application No. EP 23306382.5, filed on Aug. 16, 2023, the disclosure of which is incorporated by reference in its entirety.

FIELD OF THE INVENTION

The present invention relates to logic devices such as field programmable gate array devices, ASICs, and other such devices.

BACKGROUND

FPGAs are a type of Programmable Logic Device. They are generally based on a standard programmable Logic Block, a large number of which are arranged together to implement various functions.

FIG. 1 shows schematically an example of an FPGA system as known in the state of the art.

As shown in FIG. 1, an FPGA chip 10 comprises a number of Logic Blocks 11, for example as described above. The chip also comprises a number of input/output ports 12. Connecting these logic blocks 11 and input/output ports 12 are a number of tracks 14. At junction points of these tracks are provided and number of programmable routing areas 13. In these programmable routing areas there are provided switches which can selectively connect any pair of intersecting tracks, under the control of a logical value stored in a memory cell connected with each switch. The switch memory values are set at system start up from a non volatile memory. Accordingly, by setting the values in the switch memories as required, any connections of any Logic Block can be coupled to those of any other Logic Block, or any input/output port 12. Thus, by properly configuring the memory units to define the operation of each logic block, and the switch memories 13 to establish appropriate connections between the logic blocks, any desired functionality can be implemented.

FIG. 2 shows further detail of elements of an FPGA system as known in the state of the art.

The elements shown in FIG. 2 constitute a representative example of a partial implementation of parts of the functionality described above with respect to FIG. 1.

As shown in FIG. 2, there is provided a first Look Up Table (LUT) 21, and a second Look Up Table (LUT) 22, and a number of further LUTs (not shown). The first LUT 21 comprises seven two input multiplexers 211, 212, 213, 214, 215, 216, 217 respectively. The second LUT and further LUTs are configured similarly. These multiplexers are arranged in a cascading manner with three rows so as to constitute an 8 input multiplexer, the output of which constitutes the output of the LUT. The first row of multiplexers (211, 213, 215 and 217) in each cascade arrangement both have a total of eight inputs. These eight inputs constitute the programming inputs of the first LUT 21. The selection inputs of each row are ganged together, to constitute the three data inputs of the LUT. The data inputs and data output of the first LUT are connected to a set of tracks 2501, 2502. The inputs and outputs of the second and further LUTs are connected correspondingly to a network of further tracks (not shown). Conventionally a LUT with 3 data inputs in this manner is referred to as a "LUT3". Each of the eight programming inputs of the first LUT 21 connected to a respective Static RAM memory device 251, 252, 253, 254, 255, 256, 257, 258. Corresponding memory devices provide the configuration inputs of the second LUT 22, and the other LUTs provided in the system (not shown). These are shown schematically as Dynamic RAM devices, but may also comprise Static RAM devices, In operation, these memory devices 2*a*, 2*b*, 2*c*, 2*d*, 2*e*, 2*f*, 2*g*, 2*h*, 2*i*, 2*j*, 2*k*, 2*l*, 2*m*, 2*n*, 2*o*, 2*p*, 2*q*, 2*r*, 2*s*, 2*t*, 2*u*, 2*v*, 2*w*, 2*x*, 2*y*, 2*z*, provide a constant predetermined logical value to each of the eight programming inputs of each LUT. The content of each memory cell is shown schematically as comprising a latch built of two inverters, each receiving the output of the other, with a transistor switch, switched by a word line 23, provided to enable the selective output of the value on the output of one of the inverters in the latch to a bit line connected to a respective configuration input of the LUT 217, and also to a data line 24 by means of which the value of the latch may be set. The bit line of each memory device 2*g*, 2*h*, 2*i*, 2*j*, 2*k*, 2*l*, 2*m*, 2*n*, 2*o*, 2*p*, 2*q*, 2*r*, 2*s*, 2*t*, 2*u*, 2*v*, 2*w*, 2*x*, 2*y*, 2*z*, is connected to a row decoder 1*a* and the word line of each memory device 251, 252, 253, 254, 255, 256, 257, 258 is connected to a line decoder 1*b*. During an initiation phase for the circuit, each memory device 2*a*, 2*b*, 2*c*, 2*d*, 2*e*, 2*f*, 2*g*, 2*h*, 2*i*, 2*j*, 2*k*, 2*l*, 2*m*, 2*n*, 2*o*, 2*p*, 2*q*, 2*r*, 2*s*, 2*t*, 2*u*, 2*v*, 2*w*, 2*x*, 2*y*, 2*z*, is addressed in turn, and the desired value set to the latch in question. The logical behaviour of the LUT is response to any binary value on its three data inputs can thus be defined as required. This is the underlying basic concept of FPGA technology. It will be appreciated however that the functions that a single Logic block comprising two LUT3s can implement is limited, however by interconnecting a number of suitably configured LUTs as described above, any arbitrary combinatorial function can be implemented. This interconnection is achieved through a programmable interconnection of the data channels 2501, 2502, and further channels (not shown) carrying data from other LUTs. As shown whilst channels 2501, 2502 are arranged vertically, there is provided a further channel 2503 intersecting channels 2501, 2502. At the intersection of respective lines of channels 2501 and 2503 is provided a programmable switching unit 26. Considering that the intersection of the two lines constitutes a total of four connections at the switching unit, the switching unit comprises 6 transistor switches, arranged to make or break a connection between any two of these four connections. Each of these transistor switches is set to be open or closed by a value received from a respective static memory unit 2*a*, 2*b*, 2*c*, 2*d*, 2*e*, 2*f*. Further such programmable switching units, with corresponding static memory devices are provided at many or all intersection of tracks (not shown). These static memory devices 2*a*, 2*b*, 2*c*, 2*d*, 2*e*, 2*f*, as shown are identical to the memory devices 2*g*, 2*h*, 2*i*, 2*j*, 2*k*, 2*l*, 2*m*, 2*n*, 2*o*, 2*p*, 2*q*, 2*r*, 2*s*, 2*t*, 2*u*, 2*v*, 2*w*, 2*x*, 2*y*, 2*z*, and connected to the decoder matrix 1*a*, 1*b*, so that when during an initiation phase for the circuit, both the LUT memory devices and switch memory devices may be addressed in turn, and the desired value set to the latch in question, so that the behaviour of each LUT, and its connections to any other LUT may be configured as required.

WO2012/123243 A1, U.S. Pat. Nos. 7,463,056 B1, 6,021,513 A, 5,432,441 A, 8,091,001 B2, 5,675,589 A, and 5,027,355 A describe certain aspects of the foregoing.

The article entitled "Bridging the Gap between Soft and Hard eFPGA Design", by Victor Olubunmi Aken'Ova chapter 3.22 available from https://www.ece.ubc.ca/~lemieux/publications/akenova-masc2005.pdf provides further background information.

The structure thus defined is highly flexible, and can be reprogrammed and revised at various levels, e.g. hardware and software (configuration values), at different times, so that it can become difficult to determine unambiguously which configuration version a particular device implements.

FPGAs as described above, as well as other digital logic devices may be defined from the design stage in terms of a digital representation, referred to as an "Intellectual Property" (IP), which is used as the basis of the automated manufacturing process of physical devices implementing the design. Difficulties may arise in distinguishing one device from another insofar as they are based on a similar IP, for example in the case of different iterations of a given design. It is desirable to provide a convenient integrated mechanism for distinguishing such devices.

SUMMARY OF THE INVENTION

In accordance with the present invention in a first aspect there is provided a computer implemented method of defining a device capable of implementing a logic function, the device comprising a memory bus having a corresponding address space, and a plurality of programme memory cells, each programme memory cell being accessible for reading and/or writing via the memory bus with a respective address in the address space, wherein the device further comprises a plurality of auxiliary memory cells, each auxiliary memory cell being accessible for reading via the programme memory bus with a respective address in the address space, the select lines and/or outputs of each lookup table being programmably interconnected with the select lines or outputs of another lookup table independently of the respective values of the plurality of auxiliary memories, the method comprising obtaining a checksum value for the digital definition of logic function, finding a digital value of a predefined length which, when applied to a package checksum value comprising the checksum value for the digital definition of core functions, in accordance with a predefined operation, produces a result complying with a predefined rule, and defining an augmented digital definition of the device thereof comprising the digital definition of the logic functions and a definition of the one or more auxiliary memory cells reflecting the checksum value.

In a development of the first aspect the step of finding a digital value of a predefined length comprises testing successive random digital values of a predefined length against the predefined rule until a digital value of a predefined length which, when applied to a package checksum value comprising the checksum value for the digital definition of core functions, in accordance with a predefined operation, produces a result complying with a predefined rule is found.

In a development of the first aspect the method comprises the further step incorporating a historical checksum from a preceding iteration of the method of the first aspect to the package checksum by a predetermined operation before the step of finding a digital value of a predefined length.

In a development of the first aspect the method comprises the further step of encrypting the augmented digital definition of the Field Programmable Gate Array.

In a development of the first aspect the method comprises the further step of defining a bitstream with regard to the address space such that when the bitstream is loaded into the programme memories the Field Programmable Gate Array implement a defined logic function.

In a development of the first aspect the method comprises the further step loading the bitstream into the programme memories so as to program the Field Programmable Gate Array to implement the defined logic function.

In accordance with the present invention in a second aspect there is provided a method of interrogating a Field Programmable Gate Array defined in accordance with the first aspect, the method of interrogating comprising the step of reading the contents of the auxiliary memory cells in a sequence defined as a function of the memory space.

In a development of the second aspect some or all of the programme memory cells are configured to output their values to one or more shift registers, and wherein the step of step of reading the contents of the auxiliary memory cells comprises clocking the one or more shift registers in a predefined sequence to read out their contents, wherein the step of reading the contents of the auxiliary memory cells in a sequence defined as a function of the memory space comprises interleaving the contents of the auxiliary memory cells with the contents read from the shift registers to achieve a predefined output structure.

In accordance with the present invention in a third aspect there is provided a device defined in accordance with the method of the first aspect.

In accordance with the present invention in a fourth aspect there is provided a computer program comprising instructions which, when the program is executed by a computer, cause the computer to carry out the method of the first aspect.

In accordance with the present invention in a fifth aspect there is provided a computer-readable medium storing data defining a defined in accordance with the method of the first aspect.

In accordance with the present invention in a sixth aspect there is provided Field Programmable Gate Array capable of implementing a logic function, the Field Programmable Gate Array comprising a plurality of hardware lookup tables each comprising a plurality of select lines and/or outputs, a programme memory bus having a corresponding address space, and a plurality of programme memory cells, each programme memory cell being accessible for reading and/or writing via the programme memory bus with a respective address in the address space, the select lines and/or outputs of each lookup table being programmably interconnected with the select lines or outputs of another lookup table dependent on the respective values of the plurality of programme memories, wherein the Field Programmable Gate Array further comprises a plurality of auxiliary memory cells, each auxiliary memory cell being accessible for reading via the programme memory bus with a respective address in the address space, the select lines and/or outputs of each lookup table being programmably interconnected with the select lines or outputs of another lookup table independently of the respective values of the plurality of auxiliary memories.

In a development of the sixth aspect, one or more auxiliary memory cells returns a fixed value defined in hardware.

In a development of the sixth aspect, the address space is defined by values in two dimensions, and wherein the addresses in the address space via which the one or more auxiliary memory cells are accessible belong to a continuous region including the minimum value in each dimension of the address space and/or a continuous region including the maximum value in each dimension of the address space.

In a development of the sixth aspect, one or more auxiliary memory cells stores a watermark value, and unique identifier or a version reference.

BRIEF DESCRIPTION OF THE DRAWINGS

The above and other advantages of the present invention will now be described with reference to the accompanying drawings, in which.

DETAILED DESCRIPTION

By way of example, certain embodiments of the invention will be presented below in the context of FPGA architectures. It should be borne in mind that unless explicitly limited to the FPGA context, these embodiments apply equally to other types of logic device, as will become apparent in the following discussion.

Figure 3:
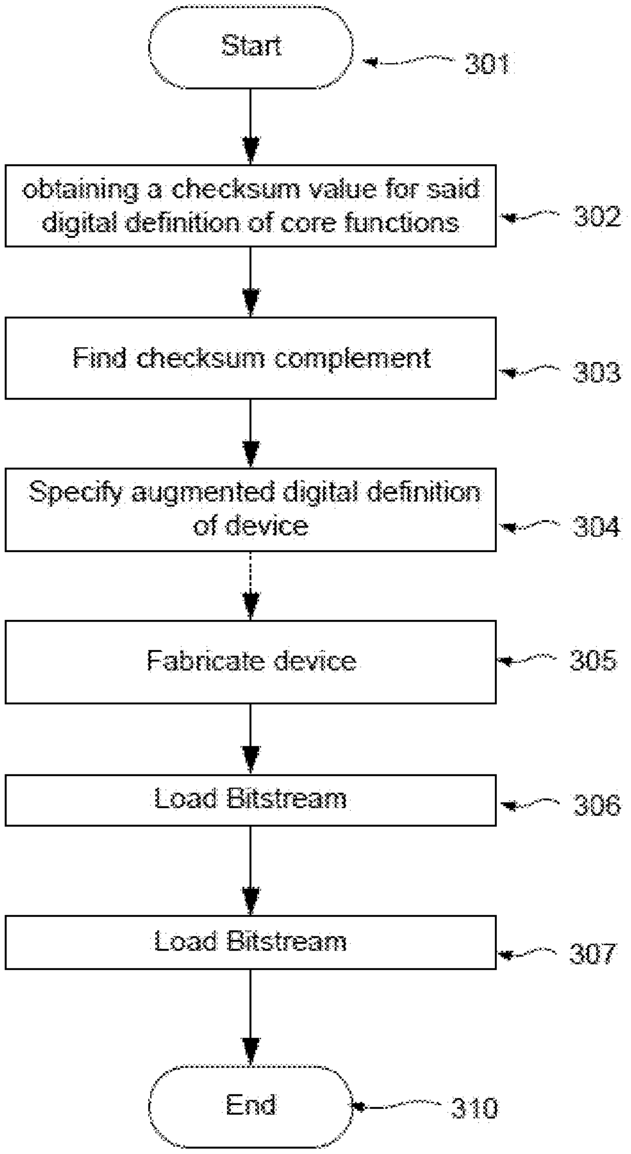
FIG. 3 presents a computer implemented method of defining a Logic device.

FIG. 3 presents a computer implemented method of defining a Logic device

Figure 1:
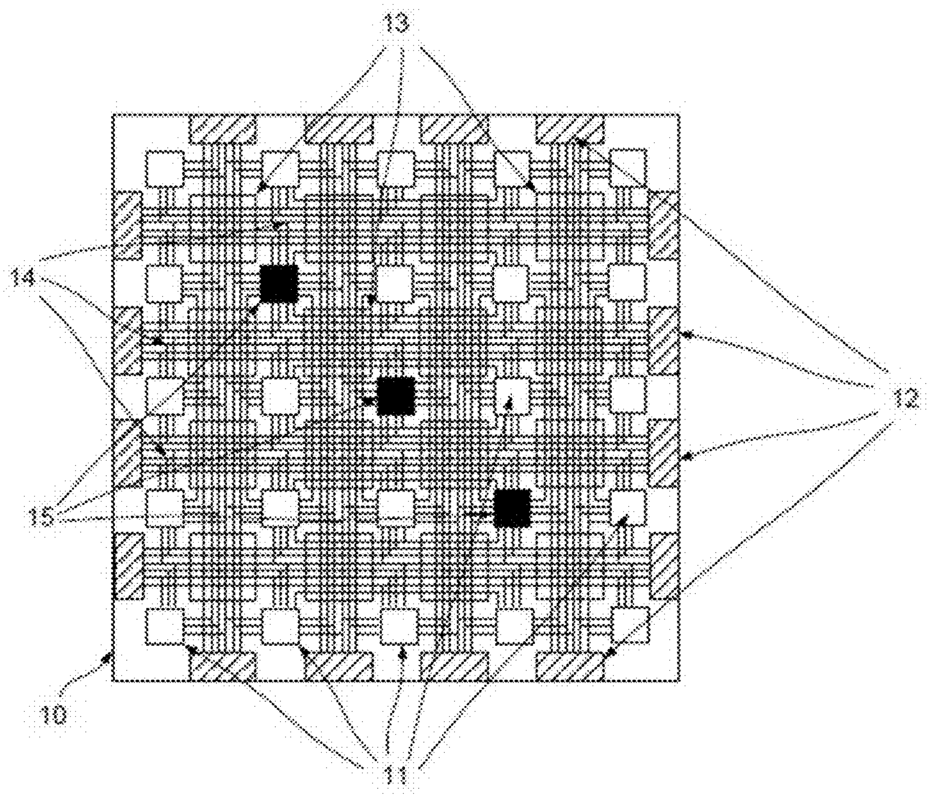
FIG. 1 shows schematically an example of an FPGA system as known in the state of the art.

As described with reference to FIGS. 1 and 2, a logic device may generally be defined with reference to a digital definition of core functions thereof, e.g. in terms of an "IP" as discussed above.

In a development of such approaches, a method starts at step3 before proceeding to a step 302 of obtaining a checksum value for the digital definition of core functions. A suitable checksum may be obtained by any suitable algorithm as will readily occur to the skilled person, such as Parity byte or parity word, Sum complement, cyclic redundancy checks, or indeed hash algorithms such as MD5 or SHA256 hashes.

The method then proceeds to step 303 of finding a digital value of a predefined length which, when applied to the checksum value obtained at step 302 produces a result complying with a predefined rule. This number may be obtained by successively generating random numbers until one satisfying the specified conditions is found. For example the predefined length may be a convenient number of bits, which as will become clear from the following discussion may be equal to, or less than, the number of auxiliary memory cells provided by the logic device. A rule may be any rule that may be applied to a digital value, such as, for example: "The number must be an odd number", "The number must be an even number", "the number must be a prime number", "the number must be a multiple of some other predefined number", "the number digits at odd locations must be all odd" "the number digits at odd locations must be all odd even", "part of the number may compare true to a predefined string", etc. A rule may comprise a combination of such requirements.

In certain embodiments, the checksum value obtained at step 303 may be augmented with additional data. For example, a historical checksum for example from a preceding iteration of the method of FIG. 4, may be incorporated into the checksum value obtained at step 303 by a predetermined operation. The previous checksum is kept on a file which is also included into the package files list of the current checksum being computed. This will create the chain. By this means, the checksum can be seen to constitute a "blockchain", tying the obtained value to only to its current version, but also to every subsequent version in a series of iterations of the described method.

The step of finding a digital value of a predefined length may optionally be implemented by testing successive random digital values of a predefined length against the predefined rule until a digital value of a predefined length which, when applied to a package checksum value comprising the checksum value for the digital definition of core functions, in accordance with a predefined operation, produces a result complying with the predefined rule is found.th.

While embodiments may relate to the definition of any logic device, certain embodiments may be particularly convenient as applied to programmable devices such as FPGAs as discussed above, where the logical function is not defined (exclusively) by the device architecture, but primarily by a bitstream that may be loaded into the device after manufacture. Embodiments may relate to the definition of such a bitstream.

Figure 4:
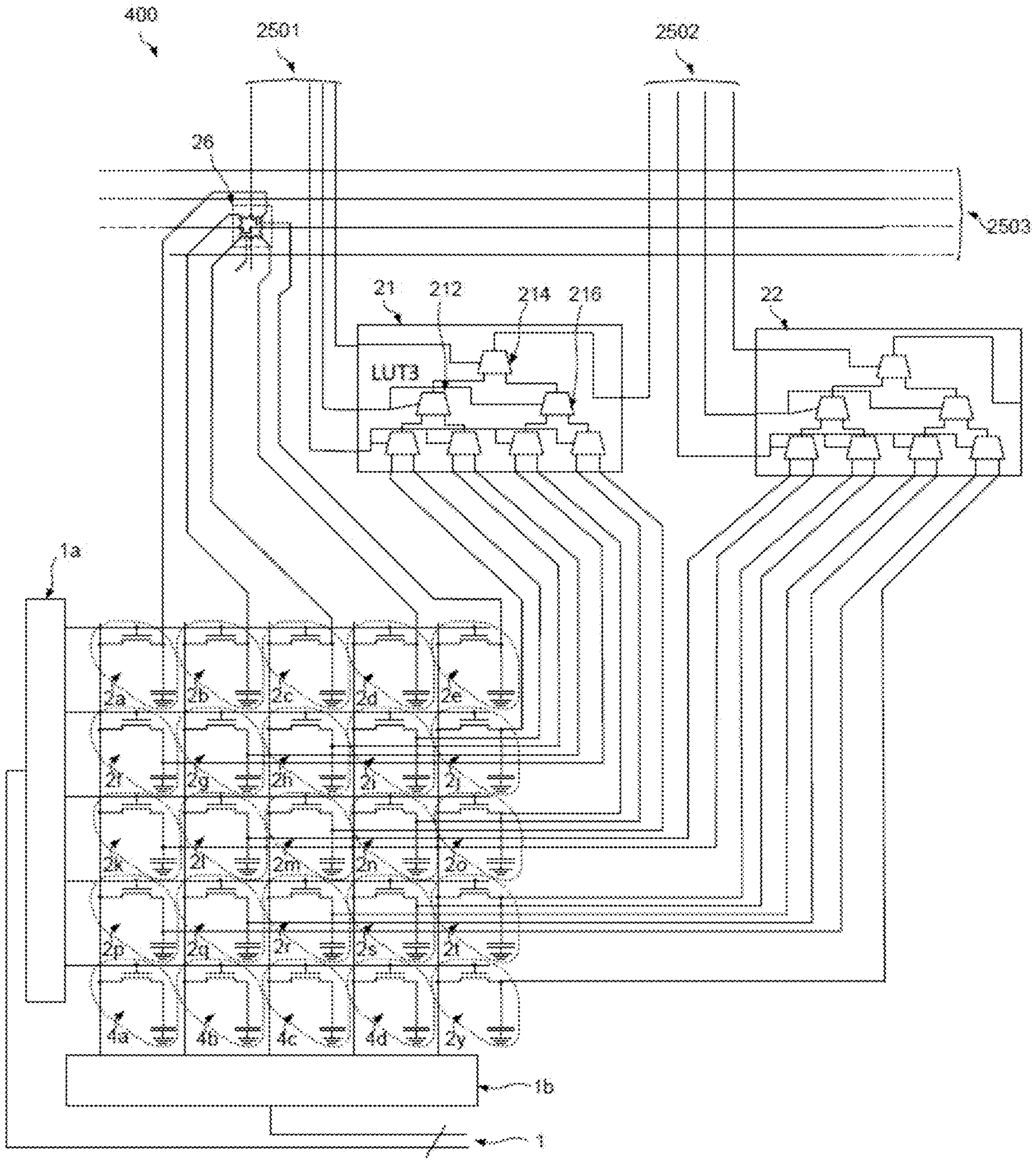
FIG. 4 presents a logic device suitable for definition in accordance with certain embodiments.

FIG. 4 presents a logic device suitable for definition in accordance with certain embodiments.

As shown in FIG. 4, there is presented a Field Programmable Gate Array 400. Certain elements of the Field Programmable Gate Array 400 correspond to those of Field Programmable Gate Array 200 described with reference to FIG. 2, and like numbered elements may be considered to correspond, and may not be further described. As will be apparent to the skilled person, the logic function may be any set of operations consistent with the capacity of the FPGA structure.

As shown, the Field Programmable Gate Array 400 comprises a plurality of hardware lookup tables 21, 21 each comprising a plurality of select lines and/or outputs 2501, 2502, 2503, a programme memory bus 1 having a corresponding address space, and a plurality of programme memory cells 2*a*, 2*b*, 2*c*, 2*d*, 2*e*, 2*f*, 2*g*, 2*h*, 2*i*, 2*j*, 2*k*, 2*l*, 2*m*, 2*n*, 2*o*, 2*p*, 2*q*, 2*r*, 2*y*, each programme memory cell being accessible for reading and/or writing via the programme memory bus 1*a*, 1*b*, with a respective address in the address space. The select lines and/or outputs 2501, 2502, 2503 of each lookup table are programmably interconnectable with the select lines or outputs 2501, 2502, 2503 of other lookup tables dependent on the respective values of the plurality of programme memories, e.g. through the memory controlled operation of switch 26.

In accordance with the innovative structure of FIG. 4 meanwhile, the Field Programmable Gate Array further comprises a plurality of auxiliary memory cells 4*a*, 4*b*, 4*c*, 4*d*, each auxiliary memory cell being accessible for reading via the programme memory bus with a respective address in the address space. The select lines and/or outputs of each lookup table being programmably interconnected with the select lines or outputs of another lookup table independently of the respective values of the plurality of auxiliary memories—that is to say, the auxiliary memory cells 4*a*, 4*b*, 4*c*, 4*d* while addressable in the same address space as the programme memory cells 2*a*, 2*b*, 2*c*, 2*d*, 2*e*, 2*f*, 2*g*, 2*h*, 2*i*, 2*j*, 2*k*, 2*l*, 2*m*, 2*n*, 2*o*, 2*p*, 2*q*, 2*r*, 2*y* do not serve to configure the FPGA device, but remain available for other uses. In particular, these auxiliary memory cells may be programmed with any arbitrary value which may be required for future reference, such as a watermark value, an unique identifier or a version reference or the like. While only four auxiliary memory cells are provided in FIG. 4, real implementations may comprise any number of cells as may be required depending on the auxiliary data to be stored.

As such, FIG. 4 presents a device capable of implementing a logic function, the device comprising a memory bus having a corresponding address space, and a plurality of programme memory cells, each programme memory cell being accessible for reading and/or writing via the memory bus with a respective address in the address space, wherein the device further comprises a plurality of auxiliary memory cells, each auxiliary memory cell being accessible for reading via the programme memory bus with a respective address in the address space, the select lines and/or outputs of each lookup table being programmably interconnected with the select lines or outputs of another lookup table independently of the respective values of the plurality of auxiliary memories.

More particularly, there is provided a Field Programmable Gate Array capable of implementing a logic function, the Field Programmable Gate Array comprising a plurality of hardware lookup tables each comprising a plurality of select lines and/or outputs, a programme memory bus having a corresponding address space, and a plurality of programme memory cells, each programme memory cell being accessible for reading and/or writing via the programme memory bus with a respective address in the address space, the select lines and/or outputs of each lookup table being programmably interconnected with the select lines or outputs of another lookup table dependent on the respective values of the plurality of programme memories, wherein the Field Programmable Gate Array further comprises a plurality of auxiliary memory cells, each auxiliary memory cell being accessible for reading via the programme memory bus with a respective address in the address space, the select lines and/or outputs of each lookup table being programmable interconnected with the select lines or outputs of another lookup table independently of the respective values of the plurality of auxiliary memories.

In the case where the logic device is a programmable device such as presented with respect to FIG. 4, the method may then proceed to an optional step 306 of defining a bitstream with regard to the address space of the Logic device such that when the bitstream is loaded into the programme memories of the Field Programmable Gate Array implement a defined logic function.

The method may then proceed to step 307 at which the bitstream obtained at step 306 may then be loaded into the programme memories of the Logic device so as to program the Logic device to implement the defined logic function, and to store the digital value of a predefined length in the auxiliary memory cells of the logic device.

Figure 5:
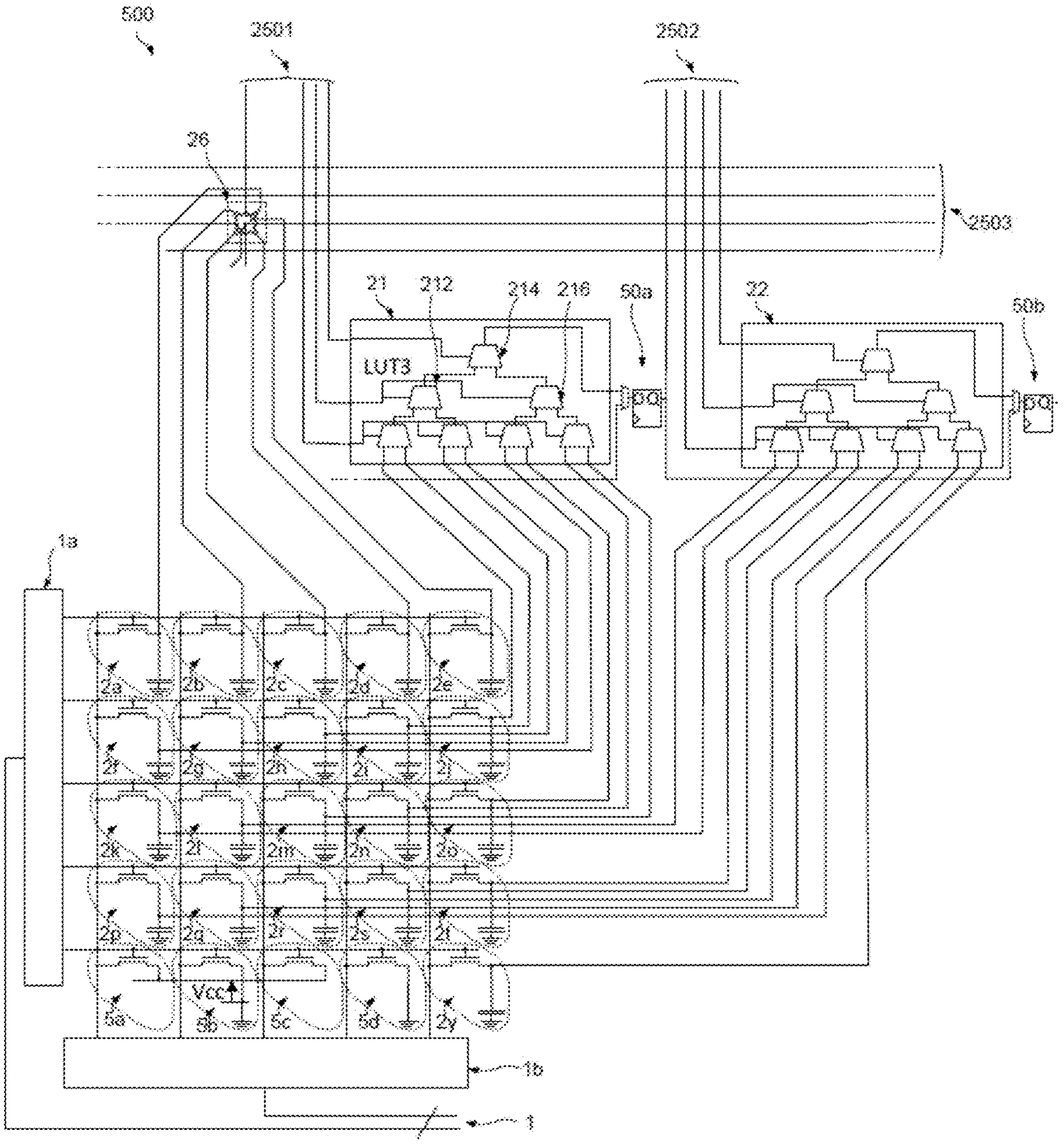
FIG. 5 presents a logic device suitable for definition in accordance with certain further embodiments.

FIG. 5 presents a logic device suitable for definition in accordance with certain further embodiments.

Figure 2:
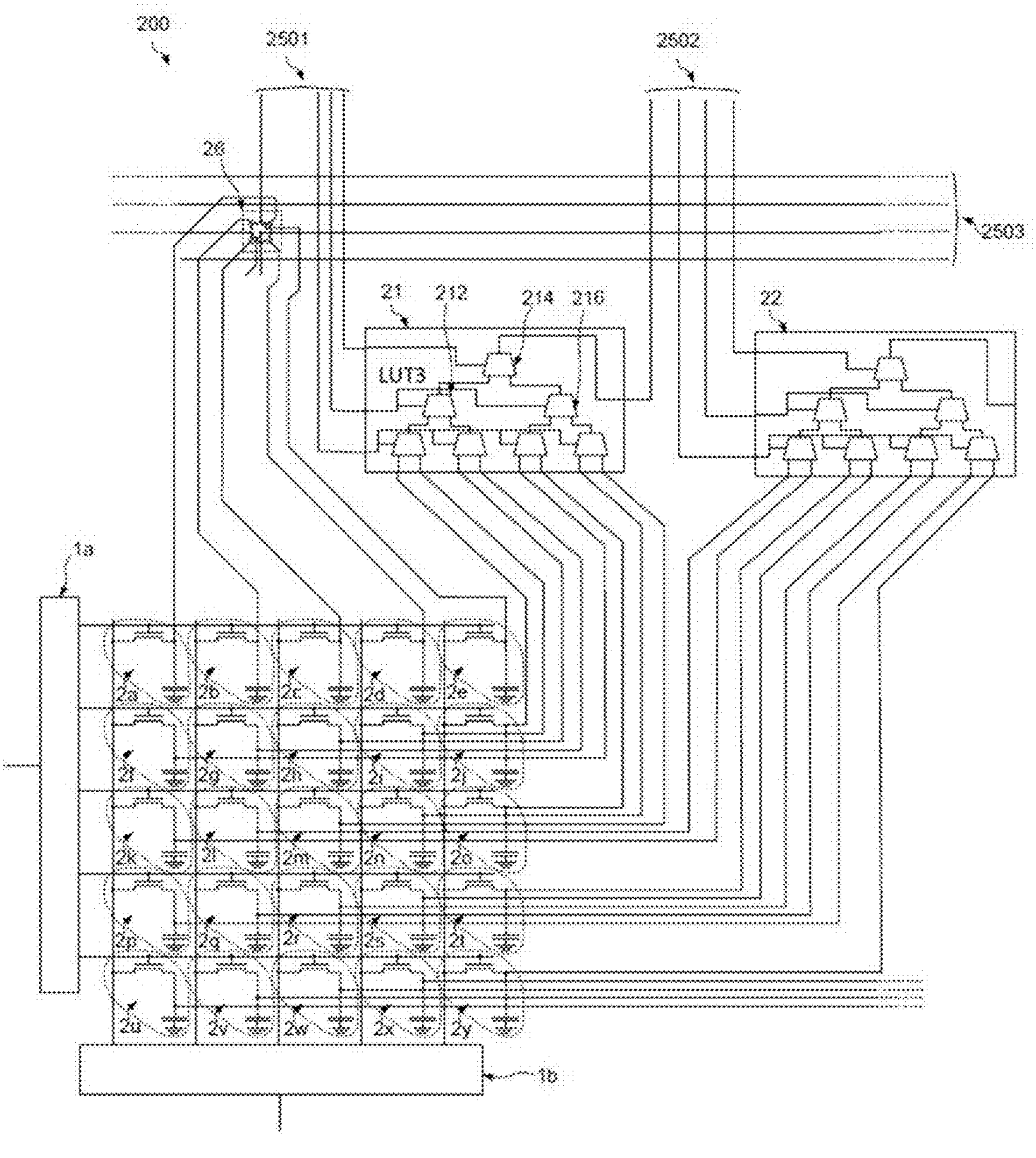
FIG. 2 shows further detail of elements of an FPGA system as known in the state of the art.

FIG. 5 corresponds to FIG. 4 as regards the elements in common with FIG. 2. Meanwhile, as shown in FIG. 5 a Field Programmable Gate Array comprises a plurality of auxiliary memory cells 5*a*, 5*b*, 5*c*, 5*d*. In accordance with the embodiment of FIG. 5, each of the auxiliary memory cells are configured to return a fixed value defined in hardware. In particular, as shown, rather than comprising a dynamic RAM circuit storing a data value in a capacitor as shown in FIG. 4, the data gate of the memory access transistor of auxiliary memories 5*a* and 5*c* is simply tied to the positive voltage rail, while the data gate of the memory access transistor of auxiliary memories 5*b* and 5*d* is tied to ground. Accordingly these particular points are no longer programmable in the way or ordinary FPGA programming memories, but may still be addressed in the usual way to retrieve information hard wired into the circuit, e.g. at design time. In particular, these auxiliary memory cells may be programmed with any arbitrary value which may be required for future reference, such as a watermark value, a unique identifier or a version reference or the like. While only four auxiliary memory cells are provided in FIG. 5, real implementations may comprise any number of cells as may be required depending on the auxiliary data to be stored.

It will be appreciated that while FIG. 5 presents an FPGA, the approach of defining “Hard Coded” memory addresses may apply to any type of logic device.

FIG. 5 additionally provides latch structures 50*a*, 50*b* at the output of each Lookup table. Specifically, these structures each comprise a multiplexer receiving an input either from the output of a respective LUT, or from a preceding latch structure, and providing an input to a respective D flip flop, the output of which is provided to an output bus 2501, 2502, and to an input of the multiplexer in the next latch structure. Accordingly, depending on the select signal sent to each multiplexer, a shift register configuration may be defined whereby the outputs of the respective LUTS may be read out.

In other types of Logic device, other mechanisms for reading the contents of the auxiliary memory addresses may be provided.

It will be appreciated that the approaches of FIGS. 4 and 5 may be combined, by providing both programmable and hardwired auxiliary memories. This may be convenient for example where a hardware version is stored in hardwired auxiliary memories, and a software configuration of the current FPGA setup is stored in a programmable auxiliary memory.

As shown in FIGS. 4 and 5, the address space is defined by values in two dimensions, i.e. corresponding to rows and columns. It will be appreciated that other configurations are possible, for example based on a single linear address space. Such a linear address space may be programmable and/or accessible using a shift register or the like.

When the address space is defined by values in two dimensions, the addresses in the address space via which the one or more auxiliary memory cells is accessible may be conveniently defined as belonging to one or more continuous regions including the minimum value in each dimension of the address space and/or a continuous region including the maximum value in each dimension of the address space. In other words, the Auxiliary memories may be conveniently defined at the edges and further still at the corners of the address space matrix. Typical FPGA bitstreams typically avoid these address combinations, so that these addresses may be set aside for the use as auxiliary memory cells with a minimal impact on the structure of the program bitstream for a given FPGA structure and logic function.

It will be appreciated that steps 306 and 307 are dependent on a correct representation of the address space of the logic device, to ensure not only that the logic device is in fact correctly configured to implement the desired logic function, but also to load the required data into the auxiliary memory cells, in the desired sequence. This may be straightforward in cases where a predefined logic device structure such as discussed with reference to FIG. 4 is to provide the substrate for the bitstream. In accordance with certain variants meanwhile, the logic device structure itself may be variable and may indeed be defined as a function of the data to be loaded into it. This approach is in particular consistent with the approach described for example with reference to FIG. 5, in which the auxiliary memory cells are hardwired to particular values, which may conveniently achieved by suitable definition of the logic device structure itself. The logic device structure may be defined, e.g. in terms of a semiconductor "IP", which may be converted using conventional industry practices into a semiconductor mask, for fabrication of corresponding logic device devices.

On this basis, the method implements an step 304 at which an augmented digital definition of the Field Programmable Gate Array is defined, comprising the digital definition of core functions and a definition of the one or more auxiliary memory cells reflecting the digital value of a predefined length. Optionally, the augmented digital definition of the Field Programmable Gate Array obtained at step 304 may be encrypted. Encryption may protect the VHDL code making its duplication much trickier while the watermarking can prove the copy in case of violation is not genuine. A further step 305 of fabricating a logic device in accordance with the augmented digital definition may then be performed. As shown, these steps may be performed before steps 306 and 307 so that the logic device structure and underlying address space are formally defined so as to support the definition and loading of the bitstream. It will nevertheless be appreciated that as an alternative step 306 may be performed after or in parallel with step 304, in which case a particular memory space may be assumed for the generation of the bitstream, and then effectively integrated in the final structure, and that step 305 may be performed after or in parallel with step 306.

The method then terminates at step 310.

As such, there is provided a computer implemented method of defining a device capable of implementing a logic function, the device comprising a memory bus having a corresponding address space, and a plurality of programme memory cells, each programme memory cell being accessible for reading and/or writing via the memory bus with a respective address in the address space, wherein the device further comprises a plurality of auxiliary memory cells, each auxiliary memory cell being accessible for reading via the programme memory bus with a respective address in the address space, the select lines and/or outputs of each lookup table being programmably interconnected with the select lines or outputs of another lookup table independently of the respective values of the plurality of auxiliary memories, the method comprising obtaining a checksum value for the digital definition of the logic function, finding a digital value of a predefined length which, when applied to a package checksum value comprising the checksum value for the digital definition of core functions, in accordance with a predefined operation, produces a result complying with a predefined rule, and defining an augmented digital definition of the device thereof comprising the digital definition of the logic functions and a definition of the one or more auxiliary memory cells reflecting the checksum value.

A logic device so defined provides additional information that may be retrieved from the auxiliary memory cells. As such, there may be defined a computer implemented method of interrogating a logic device comprising the step of reading the contents of the auxiliary memory cells in a sequence defined as a function of the memory space.

It will be appreciated that while the method of FIG. 3 is applicable to the definition of any logic device, it may be applied particularly conveniently to programmable devices, in which case the definition of the logical function may be limited to the programming bitstream, and not the full definition of the device architecture. The programmable device itself may be specially adapted for implementation of the invention by providing auxiliary memory cells for the specific purpose of the invention, or where the underlying architecture is itself defined in the augmented digital definition, it may explicitly incorporate auxiliary memory cells for the this purpose.

Accordingly, there is provided a method of defining a logic device is provided in which the definition incorporates the definition of special auxiliary memory cells reserved for the presentation of a special code, incorporating a signature of the definition as a whole so as to constitute a watermark securing the design as a whole, and possibly other information. In certain embodiments, the special code may incorporate recursively signatures from preceding versions of the same devices to as to constitute a watermark blockchain. A LUT based FPGA architecture is proposed with special addressable memory cells reserved for this purpose, in which case a programming bitstream may constitute a definition in accordance with the inventive method.

Where the Logic device comprises an output shift register as described for example with reference to FIG. 5, such that some or all of the programme memory cells are configured to output their values to one or more shift registers, the step of reading the contents of the auxiliary memory cells may comprise clocking the one or more shift registers in a predefined sequence to read out their contents. In such a context, the step of reading the contents of the auxiliary memory cells in a sequence defined as a function of the memory space may comprises interleaving the contents of the auxiliary memory cells (as retrieved by a sequential addressing of the memory space as described above) with the contents read from the shift registers to achieve a predefined output structure.

The disclosed implementations can take form of an entirely hardware embodiment (e.g. FPGA or logic device, for example as described above or obtained as a result of the method of FIG. 3), or as described with reference to FIG. 4 or 5, an entirely software embodiment (for example implementing the method described with respect to FIG. 3, or other methods presented herein) or an embodiment containing both hardware and software elements. Software embodiments include but are not limited to firmware, resident software, microcode, etc. The invention can take the form of a computer program product accessible from a computer-usable or computer-readable medium providing program code for use by or in connection with a computer or an instruction execution system.

A computer-usable or computer-readable can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium.

In some embodiments, the methods and processes described herein may be implemented in whole or part by a user device. These methods and processes may be implemented by computer-application programs or services, an application-programming interface (API), a library, and/or other computer-program product, or any combination of such entities.

The user device may be a mobile device such as a smart phone or tablet, a computer or any other device with processing capability, such as a robot or other connected device.

Figure 6:
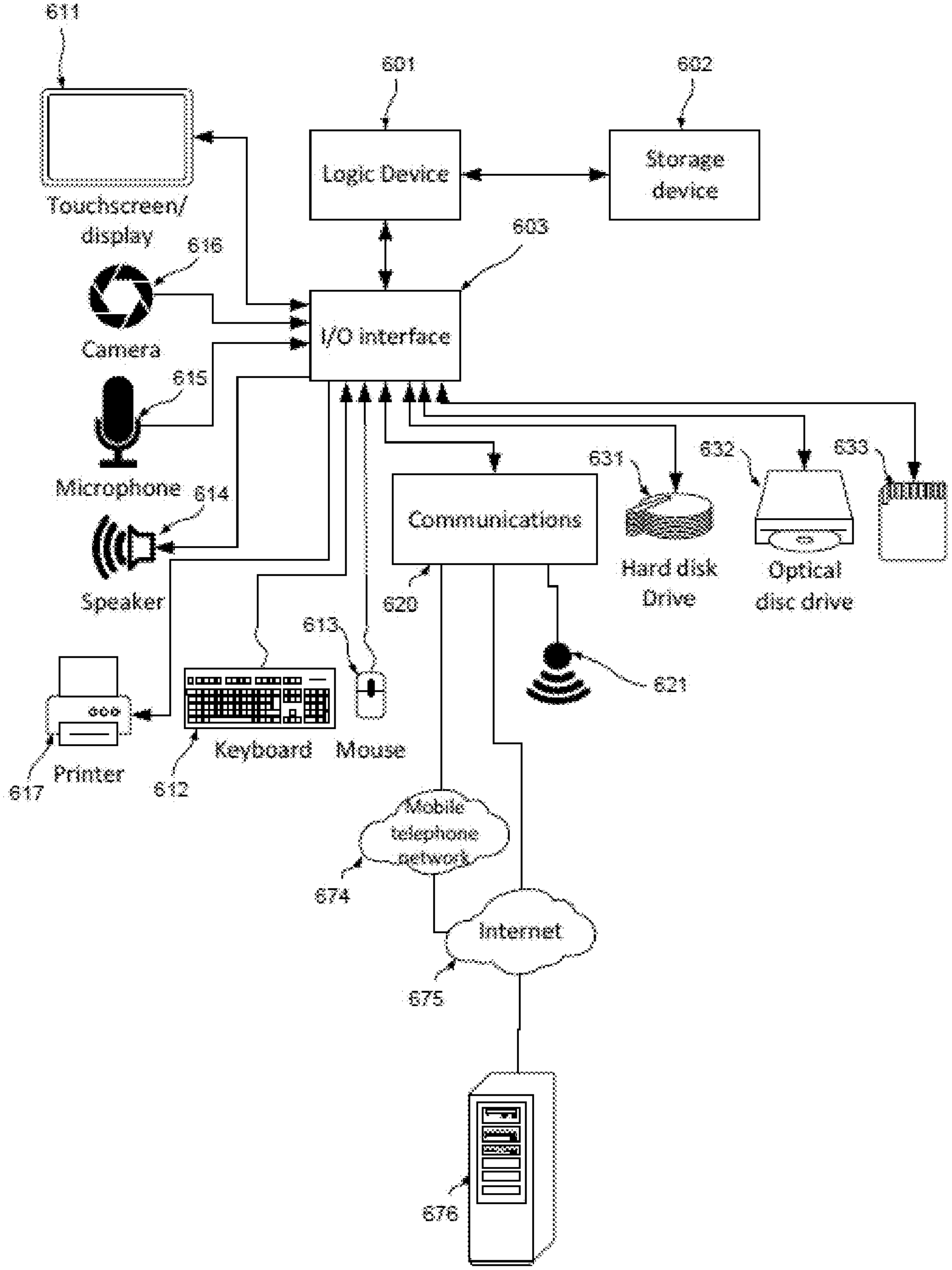
FIG. 6 shows a generic computing system suitable for implementation of embodiments of the invention.

FIG. 6 shows a generic computing system suitable for implementation of embodiments of the invention.

A shown in FIG. 6, a system includes a logic device 601 and a storage device 602. The system may optionally include a display subsystem 611, input subsystem 612, 613, 614, communication subsystem 620, and/or other components not shown.

Logic device 601 includes one or more physical devices configured to execute instructions. For example, the logic device 601 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic device 601 may include one or more processors configured to execute software instructions. Additionally or alternatively, the logic device may include one or more hardware or firmware logic devices configured to execute hardware or firmware instructions. Processors of the logic device may be single-core or multi-core, and the instructions executed thereon may be configured for sequential, parallel, and/or distributed processing. Individual components of the logic device 601 optionally may be distributed among two or more separate devices, which may be remotely located and/or configured for coordinated processing. Aspects of the logic device 601 may be virtualized and executed by remotely accessible, networked computing devices configured in a cloud-computing configuration.

Storage device 602 includes one or more physical devices configured to hold instructions executable by the logic device to implement the methods and processes described herein. When such methods and processes are implemented, the state of storage 602 device may be transformed—e.g., to hold different data.

Storage device 602 may include removable and/or built-in devices. Storage device 602 may comprise one or more types of storage device including optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage device may include volatile, non-volatile, dynamic, static, read/write, read-only, random-access, sequential-access, location-addressable, file-addressable, and/or content-addressable devices.

In certain arrangements, the system may comprise an interface 603 adapted to support communications between the Logic device 601 and further system components. For example, additional system components may comprise removable and/or built-in extended storage devices. Extended storage devices may comprise one or more types of storage device including optical memory 632 (e.g., CD, DVD, HD-DVD, Blu-Ray Disc, etc.), semiconductor memory 433 (e.g., RAM, EPROM, EEPROM, FLASH etc.), and/or magnetic memory 631 (e.g., hard-disk drive, floppy-disk drive, tape drive, MRAM, etc.), among others. Such extended storage device may include volatile, non-volatile, dynamic, static, read/write, read-only, random-access, sequential-access, location-addressable, file-addressable, and/or content-addressable devices.

It will be appreciated that storage device includes one or more physical devices, and excludes propagating signals per se. However, aspects of the instructions described herein alternatively may be propagated by a communication medium (e.g., an electromagnetic signal, an optical signal, etc.), as opposed to being stored on a storage device.

Aspects of logic device 601 and storage device 402 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The term "program" may be used to describe an aspect of computing system implemented to perform a particular function. In some cases, a program may be instantiated via logic device executing machine-readable instructions held by storage device. It will be understood that different modules may be instantiated from the same application, service, code block, object, library, routine, API, function, etc. Likewise, the same program may be instantiated by different applications, services, code blocks, objects, routines, APIs, functions, etc. The term "program" may encompass individual or groups of executable files, data files, libraries, drivers, scripts, database records, etc.

In particular, the system of FIG. 6 may be used to implement embodiments of the invention.

For example a program implementing the steps described with respect to FIG. 5 may be stored in storage device 602 and executed by logic device 601. The Digital Definition, Checksum Value, Checksum Complement and/or Augmented Digital Definition may be stored in storage 602 or the extended storage devices 632, 633 or 631. The Logic device may determine any or all of the Digital Definition, Checksum Value, Checksum Complement and/or Augmented Digital Definition. When included, display subsystem 611 may be used to present a visual representation of data held by storage device. This visual representation may take the form of a graphical user interface (GUI). As the herein described methods and processes change the data held by the storage device 602, and thus transform the state of the storage device 602, the state of display subsystem 611 may likewise be transformed to visually represent changes in the underlying data. Display subsystem 611 may include one or more display devices utilizing virtually any type of technology. Such display devices may be combined with logic device and/or storage device in a shared enclosure, or such display devices may be peripheral display devices. The display 611 and user interface may be used to support CAD operations for the definition of the Digital definition, and so forth.

Accordingly the invention may be embodied in the form of a computer program.

It will be appreciated that a "service", as used herein, is an application program executable across multiple user sessions. A service may be available to one or more system components, programs, and/or other services. In some implementations, a service may run on one or more server-computing devices.

When included, input subsystem may comprise or interface with one or more user-input devices such as a keyboard 612, mouse 611, touch screen 611, or game controller, button, footswitch, etc. (not shown). In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, colour, stereoscopic, and/or depth camera for machine vision and/or gesture recognition; a head tracker, eye tracker 660, accelerometer, and/or gyroscope for motion detection and/or intent recognition; as well as electric-field sensing componentry for assessing brain activity.

When included, communication subsystem 620 may be configured to communicatively couple computing system with one or more other computing devices. For example, communication module of may communicatively couple computing device to remote service hosted for example on a remote server 676 via a network of any size including for example a personal area network, local area network, wide area network, or the internet. Communication subsystem may include wired and/or wireless communication devices compatible with one or more different communication protocols. As non-limiting examples, the communication subsystem may be configured for communication via a wireless telephone network 674, or a wired or wireless local- or wide-area network. In some embodiments, the communication subsystem may allow computing system to send and/or receive messages to and/or from other devices via a network such as the Internet 675. The communications subsystem may additionally support short range inductive communications 621 with passive devices (NFC, RFID etc.).

The system of FIG. 6 is intended to reflect a broad range of different types of information handling system. It will be appreciated that many of the subsystems and features described with respect to FIG. 6 are not required for implementation of the invention, but are included to reflect possible systems in accordance with the present invention. It will be appreciated that system architectures vary widely, and the relationship between the different sub-systems of FIG. 6 is merely schematic, and is likely to vary in terms of layout and the distribution of roles in systems. It will be appreciated that, in practice, systems are likely to incorporate different subsets of the various features and subsystems described with respect to FIG. 6.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A computer implemented method of defining a device capable of implementing a logic function, said device comprising a memory bus having a corresponding address space, and a plurality of programme memory cells, each said programme memory cell being accessible for reading and/or writing via said memory bus with a respective address in said address space, wherein said device further comprises a plurality of auxiliary memory cells, each said auxiliary memory cell being accessible for reading via said programme memory bus with a respective address in said address space, said select lines and/or outputs of each lookup table being programmably interconnected with the select lines or outputs of another said lookup table independently of the respective values of said plurality of auxiliary memories, said method comprising obtaining a checksum value for said digital definition of logic function, finding a digital value of a predefined length which, when applied to a package checksum value comprising said checksum value for said digital definition of core functions, in accordance with a predefined operation, produces a result complying with a predefined rule, defining an augmented digital definition of said device thereof comprising said digital definition of said logic functions and a definition of said one or more auxiliary memory cells reflecting said checksum value, wherein said method further comprises incorporating a historical checksum from a preceding iteration of said method to said package checksum by a predetermined operation before said step of finding a digital value of a predefined length.

2. The method of claim 1, wherein said step of finding a digital value of a predefined length comprises testing successive random digital values of a predefined length against said predefined rule until a digital value of a predefined length which, when applied to a package checksum value comprising said checksum value for said digital definition of core functions, in accordance with a predefined operation, produces a result complying with a predefined rule is found.

3. The method of claim 1, comprising the further step of encrypting said augmented digital definition of said Field Programmable Gate Array.

4. The method of claim 1, comprising the further step of defining a bitstream with regard to said address space such that when said bitstream is loaded into said programme memories said Field Programmable Gate Array implement a defined said logic function.

5. The method of claim 4, comprising the further step loading said bitstream into said programme memories so as to program said Field Programmable Gate Array to implement said defined said logic function.

6. A method of interrogating a Field Programmable Gate Array defined in accordance with claim 1, said method of interrogating comprising the step of reading the contents of said auxiliary memory cells in a sequence defined as a function of said memory space.

7. The method of interrogating a Field Programmable Gate Array of claim 6, wherein some or all of said programme memory cells are configured to output their values to one or more shift registers, and wherein said step of step of reading the contents of said auxiliary memory cells comprises clocking said one or more shift registers in a predefined sequence to read out their contents, wherein said step of reading the contents of said auxiliary memory cells in a sequence defined as a function of said memory space comprises interleaving the contents of said auxiliary memory cells with the contents read from said shift registers to achieve a predefined output structure.

8. A device defined in accordance with the method of claim 1.

9. A computer program comprising instructions which, when the program is executed by a computer, cause the computer to carry out the method of claim 1.

10. A non-transitory computer-readable medium storing data defining a defined in accordance with the method of claim 1.

11. A Field Programmable Gate Array capable of implementing a logic function, said Field Programmable Gate Array comprising a plurality of hardware lookup tables each comprising a plurality of select lines and/or outputs, a programme memory bus having a corresponding address space, and a plurality of programme memory cells, each said programme memory cell being accessible for reading and/or writing via said programme memory bus with a respective address in said address space, the select lines and/or outputs of each lookup table being programmably interconnected with the select lines or outputs of another said lookup table dependent on the respective values of said plurality of programme memories, wherein said Field Programmable Gate Array further comprises a plurality of auxiliary memory cells, each said auxiliary memory cell being accessible for reading via said programme memory bus with a respective address in said address space, said select lines and/or outputs of each lookup table being programmably interconnected with the select lines or outputs of another said lookup table independently of the respective values of said plurality of auxiliary memories, wherein one or more said auxiliary memory cells returns a fixed value defined in hardware.

12. The Field Programmable Gate Array of claim 11, wherein said address space is defined by values in two dimensions, and wherein the addresses in said address space via which said one or more auxiliary memory cells are accessible belong to a continuous region including the minimum value in each dimension of said address space and/or a continuous region including the maximum value in each dimension of said address space.

13. The Field Programmable Gate Array of claim 11, wherein one or more said auxiliary memory cells stores a watermark value, and unique identifier or a version reference.

* * * * *